(12) United States Patent
Okamoto et al.

(10) Patent No.: US 8,674,353 B2
(45) Date of Patent: Mar. 18, 2014

(54) ORGANIC ELECTROLUMINESCENCE ELEMENT, DISPLAY DEVICE USING ORGANIC ELECTROLUMINESCENCE ELEMENT, AND METHOD OF MANUFACTURING ORGANIC ELECTROLUMINESCENCE ELEMENT

(75) Inventors: Shinichi Okamoto, Tokyo (JP); Ryo Shoda, Tokyo (JP)

(73) Assignee: Toppan Printing Co., Ltd. (JP)

( * ) Notice: Subject to any disclaimer, the term of this patent is extended or adjusted under 35 U.S.C. 154(b) by 0 days.

(21) Appl. No.: 13/434,458

(22) Filed: Mar. 29, 2012

(65) Prior Publication Data

US 2012/0187390 A1   Jul. 26, 2012

Related U.S. Application Data

(63) Continuation of application No. PCT/JP2010/065874, filed on Sep. 14, 2010.

(30) Foreign Application Priority Data

Sep. 30, 2009 (JP) ................. 2009-226859

(51) Int. Cl.
*H01L 29/12* (2006.01)
*H01L 29/08* (2006.01)

(52) U.S. Cl.
USPC ............ 257/43; 257/40; 257/79; 257/93

(58) Field of Classification Search
USPC .......... 257/40, 79, 87, 93, 98, 43; 427/61, 64, 427/66; 313/494, 497, 504, 506
See application file for complete search history.

(56) References Cited

U.S. PATENT DOCUMENTS

| 6,963,168 | B2 * | 11/2005 | Eida et al. .................. 313/506 |
| 2002/0086180 | A1 * | 7/2002 | Seo et al. .................. 428/690 |
| 2002/0158262 | A1 * | 10/2002 | Tsuchida .................. 257/91 |
| 2010/0019235 | A1 * | 1/2010 | Iizumi et al. .................. 257/40 |

FOREIGN PATENT DOCUMENTS

| JP | 05-041285 | 2/1993 |
| JP | 11-307259 | 11/1999 |
| JP | 2000-068065 | 3/2000 |
| JP | 2000-215985 | 8/2000 |

(Continued)

OTHER PUBLICATIONS

International Preliminary Report on Patentability for appl. PCT/JP2010/065874, mailed May 18, 2012, and translation of the Written Opinion of the International Searching Authority, 7 pgs.

*Primary Examiner* — George Fourson, III
*Assistant Examiner* — Wilner Jean Baptiste
(74) *Attorney, Agent, or Firm* — Squire Sanders (US) LLP

(57) ABSTRACT

One embodiment of the present invention is an organic electroluminescence element including: a substrate; a first electrode that is formed on the substrate; a luminescent medium layer that includes at least an organic luminescent layer and one or more functional layers other than the organic luminescent layer formed on the first electrode; and a second electrode that faces the first electrode with the luminescent medium layer interposed therebetween, wherein at least one functional layer formed between the first electrode and the organic luminescent layer includes first and second metal compounds and the functional layer is a functional layer in which a gradient is obtained at least partially in a film thickness direction for a ratio of the first metal compound to the second metal compound.

10 Claims, 10 Drawing Sheets

(56) References Cited

FOREIGN PATENT DOCUMENTS

| | | |
|---|---|---|
| JP | 2002-313583 | 10/2002 |
| JP | 2002-367784 | 12/2002 |
| JP | 2003-229264 | 8/2003 |
| JP | 2005-251639 | 9/2005 |
| JP | 2006-114521 | 4/2006 |
| JP | 2006-155978 | 6/2006 |
| JP | 2006-324537 | 11/2006 |
| JP | 2009-218460 | 9/2009 |
| WO | WO 2005/064994 | 7/2005 |

* cited by examiner

ORGANIC ELECTROLUMINESCENCE ELEMENT, DISPLAY DEVICE USING ORGANIC ELECTROLUMINESCENCE ELEMENT, AND METHOD OF MANUFACTURING ORGANIC ELECTROLUMINESCENCE ELEMENT

CROSS REFERENCE TO RELATED APPLICATION

This application is a continuation of International Application No. PCT/JP2010/065874, filed Sep. 14, 2010, the entire contents of which is incorporated herein by reference.

This application is based upon and claims the benefit of priority from the prior Japanese Patent Application No. 2009-226859, filed on Sep. 30, 2009, the entire content of which is incorporated herein by reference.

BACKGROUND OF THE INVENTION

1. Field of the Invention

The invention relates to an organic electroluminescence element (hereinafter, referred to as an organic EL element), a display device including the organic EL element, and a method of manufacturing the organic EL element.

2. Background Art

An organic EL element has a configuration in which an organic luminescent layer showing at least an electroluminescence phenomenon is interposed between an electrode as an anode and an electrode as a cathode. The organic EL element is a spontaneous-luminescent element in which the organic luminescent layer emits light when a voltage is applied between the electrodes, holes and electrons are injected into the organic luminescent layer, and the holes and the electrons are recombined.

To improve the luminescent efficiency, a hole-injection layer, a hole-carrying layer, or an electron-block layer is suitably selected and formed between the anode and the organic luminescent layer, and a hole-block layer, an electron-carrying layer, an electron-injection layer, or the like is suitably selected and formed between the organic luminescent layer and the cathode. Further, the organic luminescent layer is combined with the hole-injection layer, the hole-carrying layer, the electron-block layer, the hole-block layer, the electron-carrying layer, the electron-injection layer, and the like, and the combined layers are referred to as a luminescent medium layer.

Each layer of the luminescent medium layers is formed of an organic material or an inorganic material. The organic material is classified into a low-molecular material and a high-molecular material.

Examples of the low-molecular material include copper phthalocyanine (CuPc) for the hole-injection layer, N,N'-dephenyl-N,N'-bis(3-methyl phenyl)-1,1'-biphenyl-4,4'diamine (TPD) for the hole-carrying layer, tris(8-quinolinol) aluminum ($Alq_3$) for the organic luminescent layer, 2-(4-biphenylyl)-5-(4-tert-butyl-phenyl)-1,3,4,-oxazole (PBD) for the electron-carrying layer, and LiF for the electron-injection layer.

Each layer of the luminescent medium layer formed of the low-molecular material is formed so as to have a thickness of about 0.1 nm to about 200 nm mainly by a vacuum deposition method such as a resistance heating method or a vacuum drying method (dry process) such as a sputtering method.

The kinds of low-molecular materials are abundant, and an improvement in the luminescent efficiency, luminescent luminance, lifetime, or the like is expected by combinations thereof.

Examples of the high-molecular material include, for the organic luminescent layer, a material in which a low-molecular luminescent dye is solved in high molecules such as polystyrene, polymethylmethacrylate, or polyvinyl carbazole, a high-molecule fluorescent substance such as a polyphenylene vinylene derivative (hereinafter, referred to as PPV) or a polyalkyl fluorene derivative (hereinafter, referred to as PAF), and a rare-earth metal-based high-molecule phosphor.

The high-molecule material is generally solved or dispersed in a solvent and is film-formed with a thickness of about 1 nm to about 100 nm by a wet method (wet process) such as a coating or printing method.

When the wet method is used, it is possible to obtain the advantages that a film can be formed in the atmosphere, equipment is cheap, an increase in size is easy, and a film can be efficiently formed in a short time, compared to a case where a vacuum drying method such as a vacuum deposition method is used.

An organic thin film formed of the high-molecule material has the advantages that crystallization or agglomeration rarely occurs, defects such as a short-circuit or a dark spot can be prevented from occurring due to coating of a pin hole or a foreign substance of another layer.

On the other hand, examples of the inorganic material include, for the carrier-carrying layer, alkali metal elements such as Li, Na, K, Rb, Ce, and Fr, alkali earth metal elements such as Mg, Ca, Sr, and Ba, lanthanoids such as La, Ce, Pr, Nd, Sm, Eu, Gd, Db, Dy, Ho, Er, Tm, Yb, and Lu, actinoids such as Th, metal elements such as Sc, Ti, V, Cr, Fe, Co, Ni, Cu, Zn, Y, Ar, Nb, Mo, Ru, Pd, Ag, Cd, Hf, Ta, W, Re, Os, Ir, Pt, Au, Al, Ga, In, Sn, Tl, Pb, and Bi, and metalloid elements such as B, Si, Ge, As, Sb, and Te and include inorganic compounds such as alloys, oxides, carbides, nitrides, borides, sulfides, and halides thereof.

Since many inorganic materials have higher adhesion or thermal stability than organic materials, suppression of an erroneous luminescent phenomenon caused by a leakage current, reduction in the generation of non-luminescent regions called dark spots, and an improvement in luminescent characteristics or lifetime are expected for the inorganic materials. Further, since the inorganic materials can be applied to large-sized displays and mass-produced products at relatively lower costs compared to the organic materials, the inorganic materials are more advantageous in terms of reduction in costs.

There are known configurations (see JP-A-11-307259, JP-A-5-41285, JP-A-2000-68065, JP-A-2000-215985, JP-A-2006-114521, and JP-A-2006-155978) in which an inorganic hole-injection layer formed of an inorganic material is formed between an organic luminescent layer and an anode serving as a hole-injection electrode.

Further, there are known configurations (see JP-A-2002-367784, JP-A-5-41285, JP-A-2000-68065, and JP-A-2006-155978) in which an inorganic electron-injection layer formed of an inorganic material is formed between the organic luminescent layer and a cathode serving as an electron-injection electrode.

When a process subsequent to a process of forming the inorganic material layer includes a manufacturing process of forming a film in the atmosphere by a wet method, a problem may arise in that the light luminescent efficiency, the luminescent luminance, the lifetime, or the like may deteriorate since an undesirable phenomenon such as a change in the physical properties of the inorganic material occurs due to a liquid used in the process or the oxygen or moisture of the atmosphere.

For example, molybdenum oxide is known as a useful material which is an example of a hole-carrying material or an electron-injection material, since film formation is easy, a hole-injection function from a hole-injection electrode is high, a function of reliably carrying holes is excellent, and stability is high.

The molybdenum oxide is classified broadly into molybdenum trioxide ($MoO_3$) and molybdenum dioxide ($MoO_2$). Since the transmittance of molybdenum trioxide is high and molybdenum dioxide is low at the time of forming a film, molybdenum trioxide is generally used.

However, molybdenum trioxide is slightly soluble in water. Therefore, since molybdenum trioxide is formed and then reacts to moisture, the physical properties of molybdenum trioxide may easily vary. On the contrary, since molybdenum dioxide or most of the other inorganic compounds is insoluble in water, the physical properties of molybdenum dioxide or most of the other inorganic compounds scarcely vary.

In particular, when a process of forming a luminescent medium layer adjacent to molybdenum oxide includes a manufacturing process, such as transportation or film formation, performed in the atmosphere, the film may deteriorate due to a deterioration causing factor such as moisture. For this reason, a problem may arise in that display characteristics such as luminescent efficiency, luminescent luminance, or lifetime may deteriorate in some cases.

That is, when the luminescent medium layer is laminated only by a vacuum drying method, the amount and influence of deterioration causing factor adsorbed on the surface of molybdenum trioxide is small. However, when the manufacturing process of forming the film in the atmosphere is included, the display characteristics may considerably deteriorate.

Further, when a water-based solvent, an alcohol-based solvent, a ketone-based solvent, a carboxylic acid-based solvent, a nitryl-based solvent, or an ester-based solvent is used in the manufacturing process of forming the film in the atmosphere as in a wet method, a problem may arise in that particularly the luminescent efficiency and the luminescent luminance may deteriorate since molybdenum trioxide is solved and the physical properties and the film thickness are changed.

As a method of preventing the influence of the deterioration causing factor, there is a known method of preventing the deterioration causing factor by containing another metal compound having a strong environmental tolerance or a strong solvent tolerance in the metal compound used to form one layer of the luminescent medium layer and using the metal compound as a mixture film.

Patent document 1: JP-A-H11-307259
Patent document 2: JP-A-2002-367784
Patent document 3: JP-A-H05-41285
Patent document 4: JP-A-2000-68065
Patent document 5: JP-A-2000-215985
Patent document 6: JP-A-2006-114521
Patent document 7: JP-A-2006-155978

SUMMARY OF THE INVENTION

However, combinations of first and second metal compounds are quite restrictive due to the compatibility between various matter properties including a work function of a metal compound mixed film and layers adjacent to the metal compound mixed film. As a result, the environmental tolerance and the solvent tolerance can be obtained depending on the manufacturing process or the combinations of two upper and lower layers adjacent to the mixed film. However, the satisfactory combinations of the first and second metal compounds may not be realized in some cases, for example, when sufficient luminescent characteristics may not be obtained or when the luminescent characteristics are satisfactory but sufficient tolerances may not be obtained.

Further, even when satisfactory solvent tolerance, the satisfactory environmental tolerance, satisfactory high luminescent efficiency, the satisfactory high luminescent luminance, and satisfactory lifetime are obtained in some combinations by a metal compound mixed film, new luminescent efficiency, luminescent luminance, and lifetime have to be improved.

The invention is devised in the light of the above-mentioned circumstance and an object of the invention is to provide a method of manufacturing an organic EL element that has environmental tolerance or solvent tolerance by the use of a metal compound mixed film in various manufacturing processes or combinations of layers adjacent to the metal compound mixed film and has compatibility between the characteristics of high efficient luminescence, high luminance luminescence, and long lifetime. Further, another object of the invention is to provide an EL element and a method of manufacturing a display device that has the characteristics of high efficient luminescence, high luminance luminescence, and long lifetime obtained by the use of a normal metal compound mixed film.

According to an aspect of the invention, there is provided an organic electroluminescence element including: a substrate; a first electrode that is formed on the substrate; a luminescent medium layer formed on the first electrode, the luminescent medium layer includes at least an organic luminescent layer and one or more functional layers other than the organic luminescent layer; and a second electrode that faces the first electrode with the luminescent medium layer interposed between the second electrode and the first electrode. At least one functional layer is formed between the first electrode and the organic luminescent layer and includes first and second metal compounds, and a gradient for a ratio of the first metal compound to the second metal compound is obtained at least partially in a film thickness direction of one of the at least one functional layer.

In the organic electroluminescence element according to the aspect of the invention, the functional layer having the gradient may be a hole-injection layer or a hole-carrying layer.

In the organic electroluminescence element according to the aspect of the invention, the ratio of the first metal compound to the second metal compound may monotonically increase toward a side of the second electrode.

In the organic electroluminescence element according to the aspect of the invention, the ratio of the first metal compound to the second metal compound may monotonically decrease toward a side of the second electrode.

In the organic electroluminescence element according to the aspect of the invention, the functional layer having the gradient includes a first layer which has the gradient and in which a percentage of the second metal compound is 0 toward a side of the second electrode and a second layer which is formed on the layer on a side of the second electrode and is formed of only the first metal compound, wherein the first layer and the second layer may be continuously laminated.

In the organic electroluminescence element according to the aspect of the invention, the functional layer having the gradient includes a first layer which has the gradient and in which a percentage of the second metal compound decreases toward a side of the second electrode in the entire functional layer and a second layer which is formed to be adjacent the first layer and formed on the side of the second electrode and in which the second metal compound is mixed at a constant percentage equivalent to a percentage of the second metal compound at an adjacent part of the first layer, wherein the first layer and the second layer may be continuously laminated.

In the organic electroluminescence element according to the aspect of the invention, the functional layer having the gradient includes a first layer which has the gradient and in which a percentage of the second metal compound is 0 toward a side of the first electrode and a second layer which is formed on the first layer and on the side of the first electrode and is formed of only the first metal compound, wherein the first layer and the second layer may be continuously laminated.

In the organic electroluminescence element according to the aspect of the invention, the functional layer having the gradient includes a first layer which has the gradient and in which a percentage of the second metal compound decreases toward a side of the first electrode in the entire functional layer and a second layer which is formed to be adjacent the first layer and on the side of the first electrode and in which the second metal compound is mixed at a constant percentage equivalent to a percentage of the second metal compound at an adjacent part of the first layer, wherein the first layer and the second layer may be continuously laminated.

In the organic electroluminescence element according to the aspect of the invention, the first metal compound may be molybdenum oxide.

In the organic electroluminescence element according to the aspect of the invention, the second metal compound may be one of indium oxide, titanium oxide, iridium oxide, tantalum oxide, nickel oxide, tungsten oxide, vanadium oxide, tin oxide, lead oxide, niobium oxide, aluminum oxide, copper oxide, manganese oxide, praseodymium oxide, chromium oxide, bismuth oxide, calcium oxide, barium oxide, cesium oxide, lithium fluoride, and sodium fluoride, zinc selenide, zinc telluride, gallium nitride, gallium nitride indium, magnesium silver, aluminum lithium, and copper lithium or a mixture thereof.

According to another aspect of the invention, there is provided a method of manufacturing the organic electroluminescence element according to the above-described aspect of the invention. The method includes a film forming step of having a gradient in a film thickness direction for a mixture ratio of the first and second metal compounds.

In the method according to the aspect of the invention, the film forming step may be one of a deposition method, a sputtering method, and a CVD method.

The method according to the aspect of the invention may further include a step of forming at least one luminescent medium layer coming into contact with the functional layer having the gradient by a wet method.

In the method according to the aspect of the invention, the wet method may be a printing method.

In the method according to the aspect of the invention, the printing method may be a relief printing method.

According to still another aspect of the invention, there is provided a display device including the organic electroluminescence element as display medium according to the above-described aspect of the invention.

DETAILED DESCRIPTION OF THE INVENTION

Figure 1:
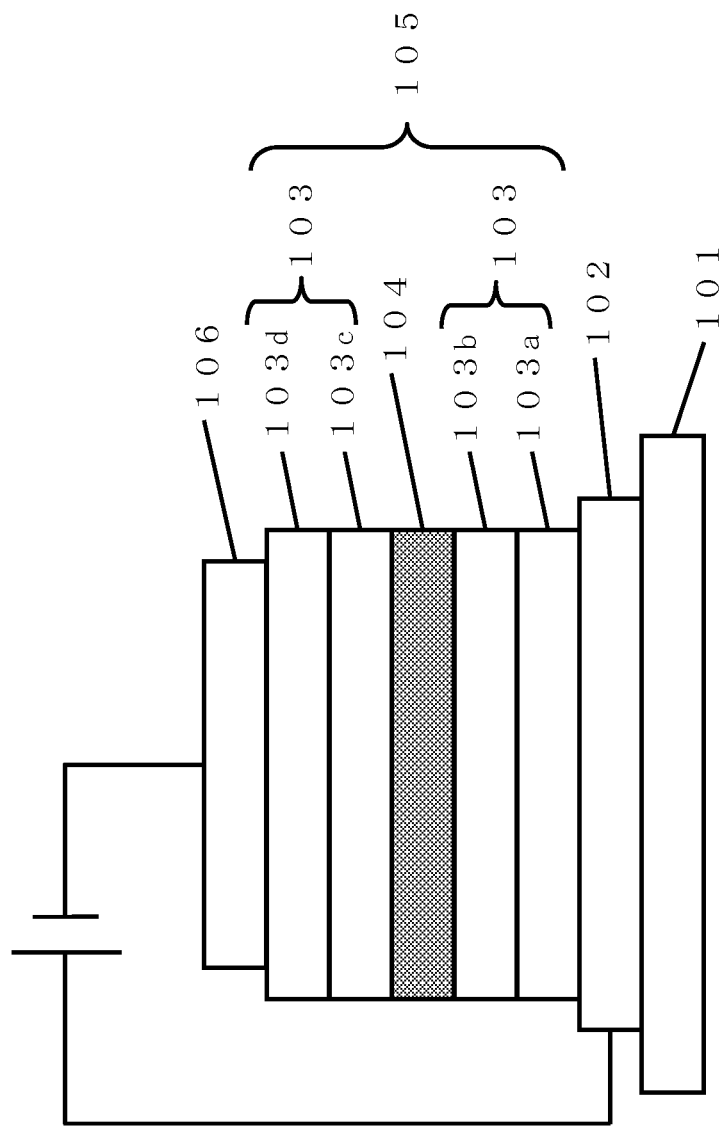
FIG. 1 is a diagram illustrating an example of an organic EL element according to the invention.

Hereinafter, embodiments of the invention will be described with reference to the drawings. Further, the drawings in the following embodiments are drawings used to describe the configuration of the invention. The sizes, thicknesses, dimensions, and the like of respective units shown in the drawings are different from actual sizes, thicknesses, dimensions, and the like. The invention is not limited thereto.

FIG. 1 is a diagram illustrating an example of an organic EL element according to the invention. FIG. 1 is a schematic sectional view illustrating the organic EL element according to the invention. As shown in FIG. 1, the organic EL element includes a substrate 101, a first electrode (anode) 102, a luminescent medium layer 105, and a second electrode (cathode) 106. The luminescent medium layer 105 has a lamination structure of an organic luminescent layer 104 that includes one or more layers and a functional layer 103 that includes one or more layers. The functional layer 103 includes a hole-carrying layer, a hole-injection layer, an inter-layer layer, an electron-block layer, an electron-carrying layer, an electron-injection layer, and a hole-block layer. The functional layer 103 has an arrangement configuration in which, for example, a layer 103a serves as the hole-carrying layer and a layer 103b serves as the hole-injection layer, the inter-layer layer, or the electron-block layer, a layer 103c serves as the electron-injection layer or the hole-block layer, and a layer 103d serves as the electron-carrying layer. The organic EL element according to the invention includes, as the luminescent medium layer, the one-layered functional layer 103 including an organic luminescent layer emitting light and a mixture gradient layer described below, at least at an interface or inside a layer, but has any lamination structure. For example, even in a reverse structure in which the first electrode serves as a cathode and the second electrode serves as an anode, plural hole-carrying layers or plural hole-injection layers may be laminated.

Figure 2:
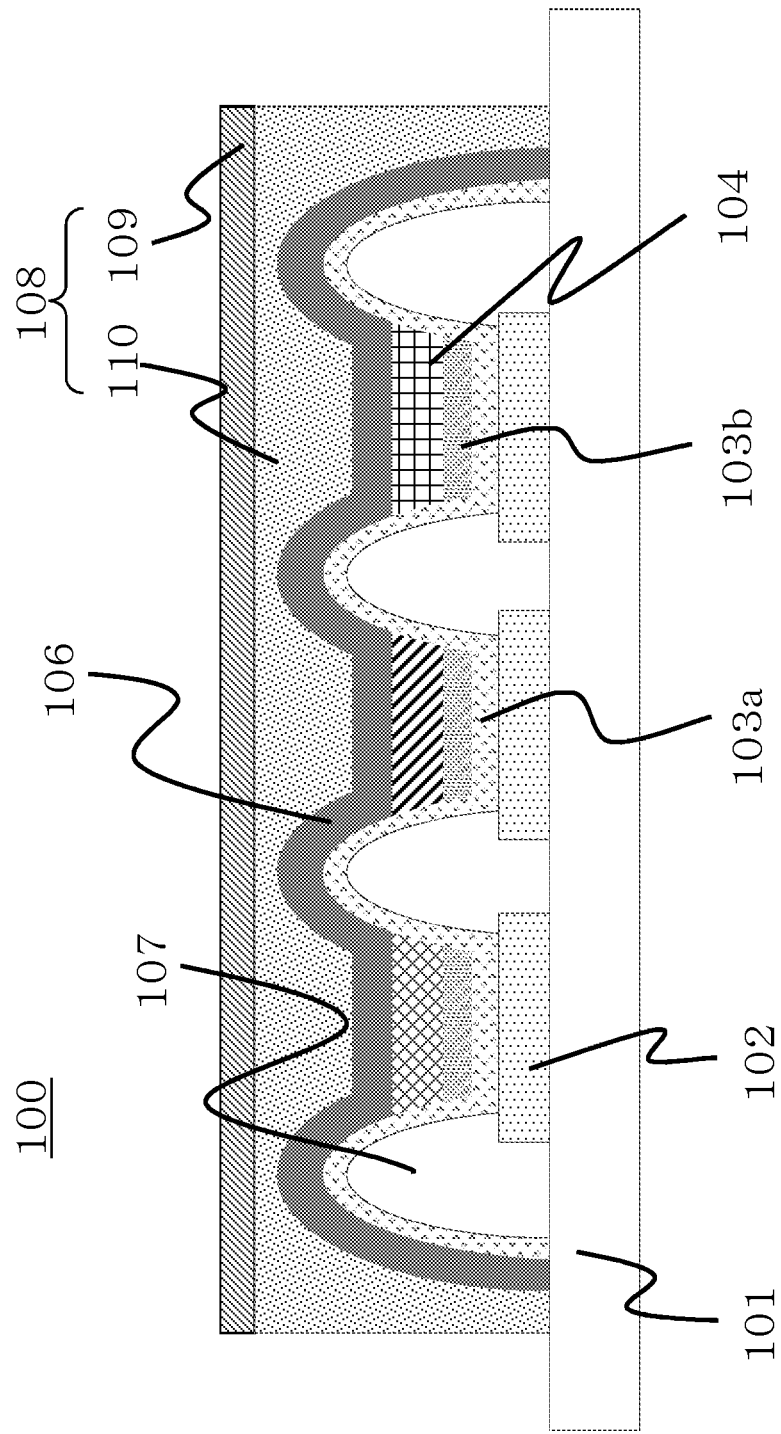
FIG. 2 is a diagram illustrating an example of a display device using an organic EL element of the invention.

FIG. 2 is a sectional view illustrating an organic EL display device. An organic EL display device 100, in which the organic EL element shown in FIG. 1 according to the embodiment of the invention is arranged in a substrate, pixel electrodes (anodes) 102 partitioned for luminescent layer regions (pixels), respectively, and insulation layers 107 partitioning the pixels of the pixel electrodes in a substrate 101. It is preferable to form the insulation layer in an end of the pixel electrode in order to prevent short-circuit. In general, the insulation layers are formed in a stripe shape or a lattice shape. In a case of an active matrix driving type, the insulation layer may be used to form a thin film transistor (TFT). As described above, the organic EL display device 100 includes the insulation layer 107 having a bank function of preventing a coating liquid from being mixed, when the luminescent medium layer 105 is formed by a wet process. The organic EL display device shown in FIG. 2 further includes, as the luminescent medium layer, the hole-carrying layer 103a formed on the upper side of the pixel electrode, the inter-layer layer 103b formed on the hole-carrying layer, the organic luminescent layer 104 formed on the inter-layer layer, the counter electrode (cathode) 106 formed to cover the entire surface of the organic luminescent layer, the functional layer 105 including the pixel electrode, the insulation layer, the hole-carrying layer, the inter-layer layer, and the organic luminescent layer, and a sealing member 108 coming into contact with the substrate 101 so cover the counter electrode.

Mixture Gradient Layer

The mixture gradient layer according to the invention of the invention is configured as the function layer 103. As a more optimum arrangement configuration, it is preferable to form the mixture gradient layer between the anode 102 and the organic luminescent layer 104. Further, when the mixture gradient layer is formed on the anode, the mixture gradient layer can be configured as a layer that has a hole-injection property and a hole-carrying property.

The mixture gradient layer includes a first metal compound having carrier (electron/hole) injection and carrying properties and a second metal compound having a property different from the first metal compound. The mixture gradient layer is a layer in which a mixture ratio is changed in the film surface normal direction of the mixture gradient layer, that is, along a path from the electrode to the organic luminescent layer.

Here, on the assumption that x1 is a distance from a first electrode interface and f(x) is a mixture ratio of the first metal compound, a function f(x) of the mixture ratio is an extended monotonically increasing function satisfying "$f(x1) \leq f(x2)$" or an extended monotonically decreasing function satisfying "$f(x1) \geq f(x2)$" where x1<x2. That is, it is preferable that the gradient of the mixture ratio constantly increases or decreases. When the gradient of the mixture ratio monotonically increases or monotonically decreases, an energy function is correlated therewith, and thus carrier (electron/hole) injection efficiency is excellent. For example, when the mixture gradient layer is used as the hole-carrying layer 103a, charge injection and tolerance properties are improved as an effect obtained as the mixture of the second metal compound with respect to the first metal compound. In this case, when mobility may decrease and a carrying property may deteriorate, for example, the mixture ratio of the second metal compound is maximized near a layer coming into contact with the anode 102 and the mixture ratio of the second metal compound is decreased toward the cathode. Hereinafter, the description will be made on the assumption that the first metal compound is a metal compound with main components (50 wt % or more) with respect to the entire mixture layer. Further, the first and second electrodes serve as an anode and a cathode, respectively, but the invention is not limited thereto.

In the mixture gradient layer, the first metal compound can be selected from transition metal, oxide, fluoride, boride, and nitride belonging to group III-B so as to have a film thickness of 100 nm or less. Molybdenum oxide with an excellent charge injection property and the carrying property is more preferable.

Examples of the second metal compound in the mixture gradient layer include transition metal, elements of group III-B, and compounds thereof. There is a method of controlling a film formation speed of one metal compound so as to set the gradient of a desired mixture ratio by performing co-deposition on the first metal compound together with any one of indium oxide, titanium oxide, iridium oxide, tantalum oxide, nickel oxide, tungsten oxide, vanadium oxide, tin oxide, lead oxide, niobium oxide, aluminum oxide, copper oxide, manganese oxide, praseodymium oxide, chromium oxide, bismuth oxide, calcium oxide, barium oxide, cesium oxide, lithium fluoride, and sodium fluoride, or several oxides thereof. Alternatively, there is a method of controlling the film formation speed of one metal compound in a binary sputter technique. Further, a method of setting the gradient of a mixture ratio by arranging different mixture ratios in parallel for a mixture target formed by the first and second metal compounds or a method of arranging the depositions in parallel can be taken into consideration. Any method can be selected. Furthermore, the second metal compound may contain plural metal compounds.

A known deposition sputtering method can be used as a method of forming the mixture gradient layer. Any method can be selected from a method of performing co-deposition on the first and second metal compounds in vacuum and a method of sputtering a mixture target formed by a single substance metal of the material of the first metal compound and a single substance metal of the material of the second metal compound in a mixed gas of an oxygen gas and an inert gas. In consideration of process stability or simplicity of the process, the method of sputtering the mixture target is more preferable.

Figure 3:
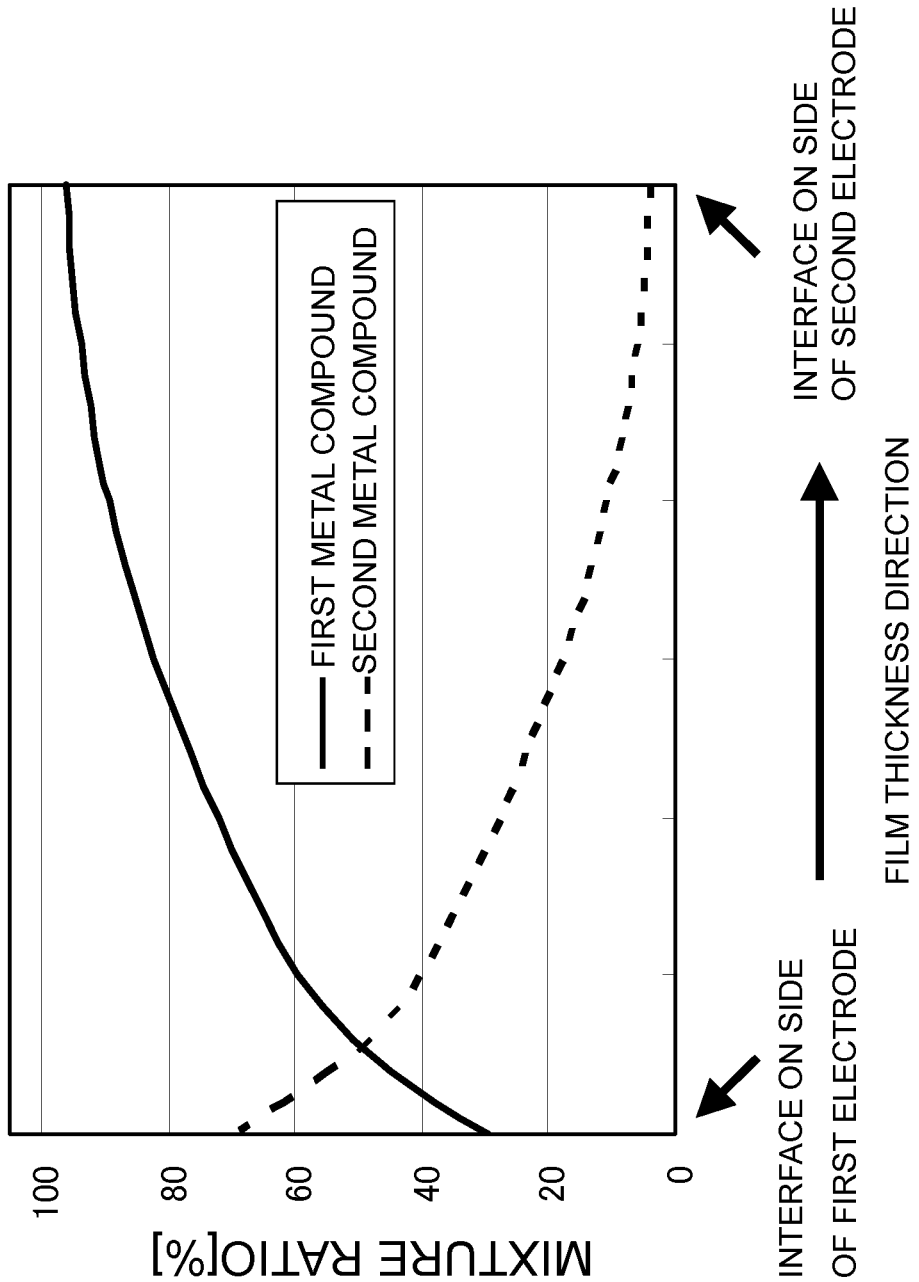
FIG. 3 is a diagram illustrating an example of a mixture ratio distribution of a mixture gradient layer according to the invention.

FIG. 3 is a graph illustrating a change in the mixture ratio of the mixture gradient layer in accordance with a first mode of the organic EL element of the invention. In this mode, the mixture gradient layer having the functions of the hole-injection layer and the hole-injection layer is laminated on the first electrode (for example, an anode) 102. The graph shows a relation between the distance between the first electrode and the organic luminescent layer and a mixture ratio (wt %). As shown in FIG. 3, the ratio of the second metal compound is the largest on the side of the organic luminescent layer and the ratio of the first metal compound increases in the direction of the organic luminescent layer (the side of the second electrode such as a cathode), and thus the entire layer has a gradient. When the first and second metal compounds are selected in terms of the surface of a work function, it is preferable to select each metal compound having with a work function close to the work function of an adjacent layer in terms of the carrier injection property.

Further, the ratio of the second metal compound is preferably 50 wt % or more in the interface on the side of the first electrode and the ratio of the first metal compound is preferably 50 wt % or more in the interface on the side of the second electrode, since the function layer with an excellent injection property in each interface can be realized. This is because the characteristics of the metal compound as the main component function. The same is applied to second and third modes described below.

Figure 4:
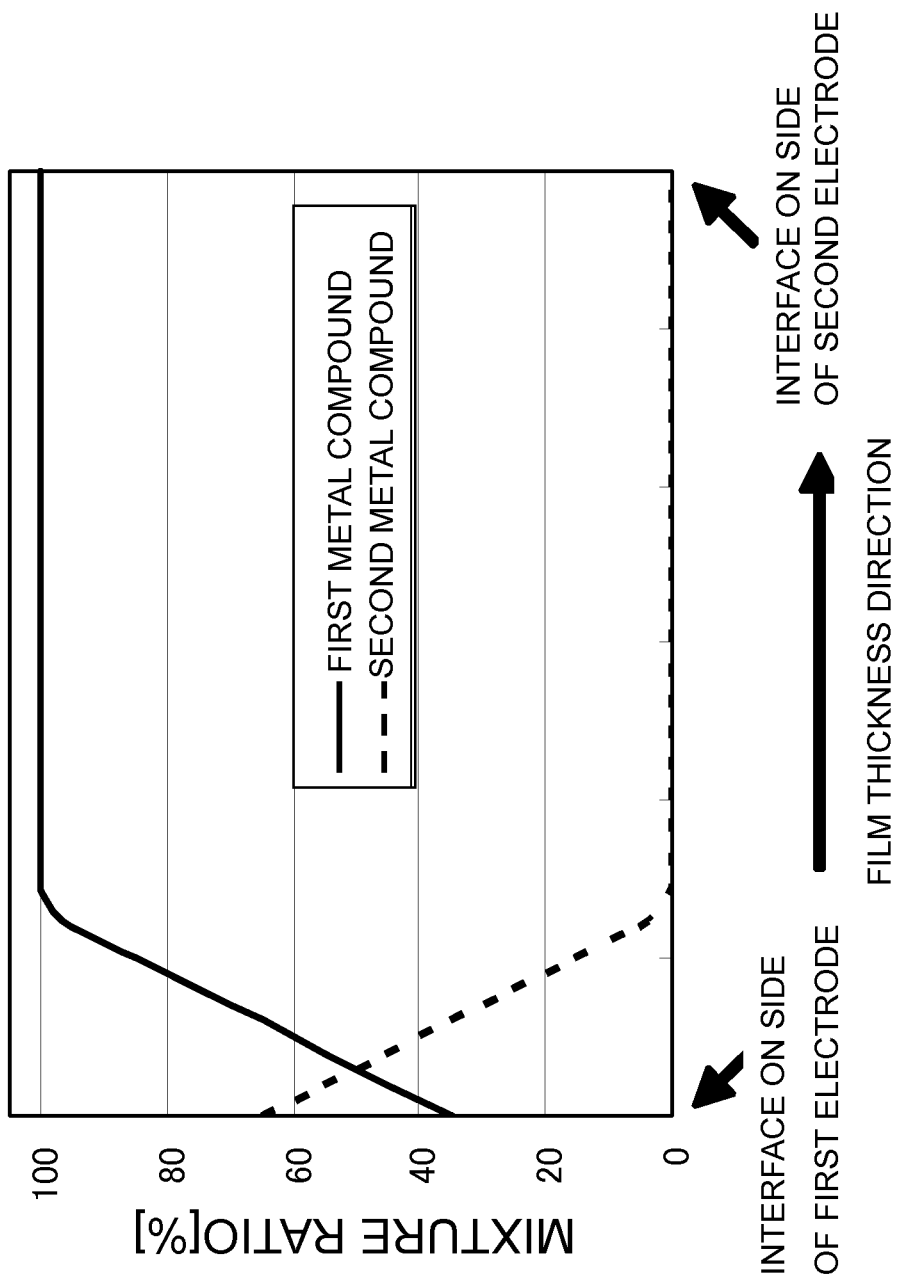
FIG. 4 is a diagram illustrating an example of the mixture ratio distribution of the mixture gradient layer according to the invention.

FIG. 4 is a graph illustrating a change in the mixture ratio of the mixture gradient layer in accordance with a second mode of the organic EL element of the invention. In this mode, since the laminated mixture gradient layer is laminated on the first electrode 102, the ratio of the second metal compound is 0 in partway along, and thereafter, only the first metal compound is formed. Therefore, the entire mixture gradient layer includes two layers: a layer which has the gradient in which the ratio of the second metal compound is 0 on the side of the second electrode and a layer which is formed only by the first metal compound. When the first metal compound can be formed of a material, such as molybdenum oxide, with an excellent hole-carrying property, the hole carrying property can be ensured by maximizing the mixture ratio of the second metal compound near a layer coming into contact with the first electrode to improve the hole injection property and forming only a first metal compound from partway along.

Figure 5:
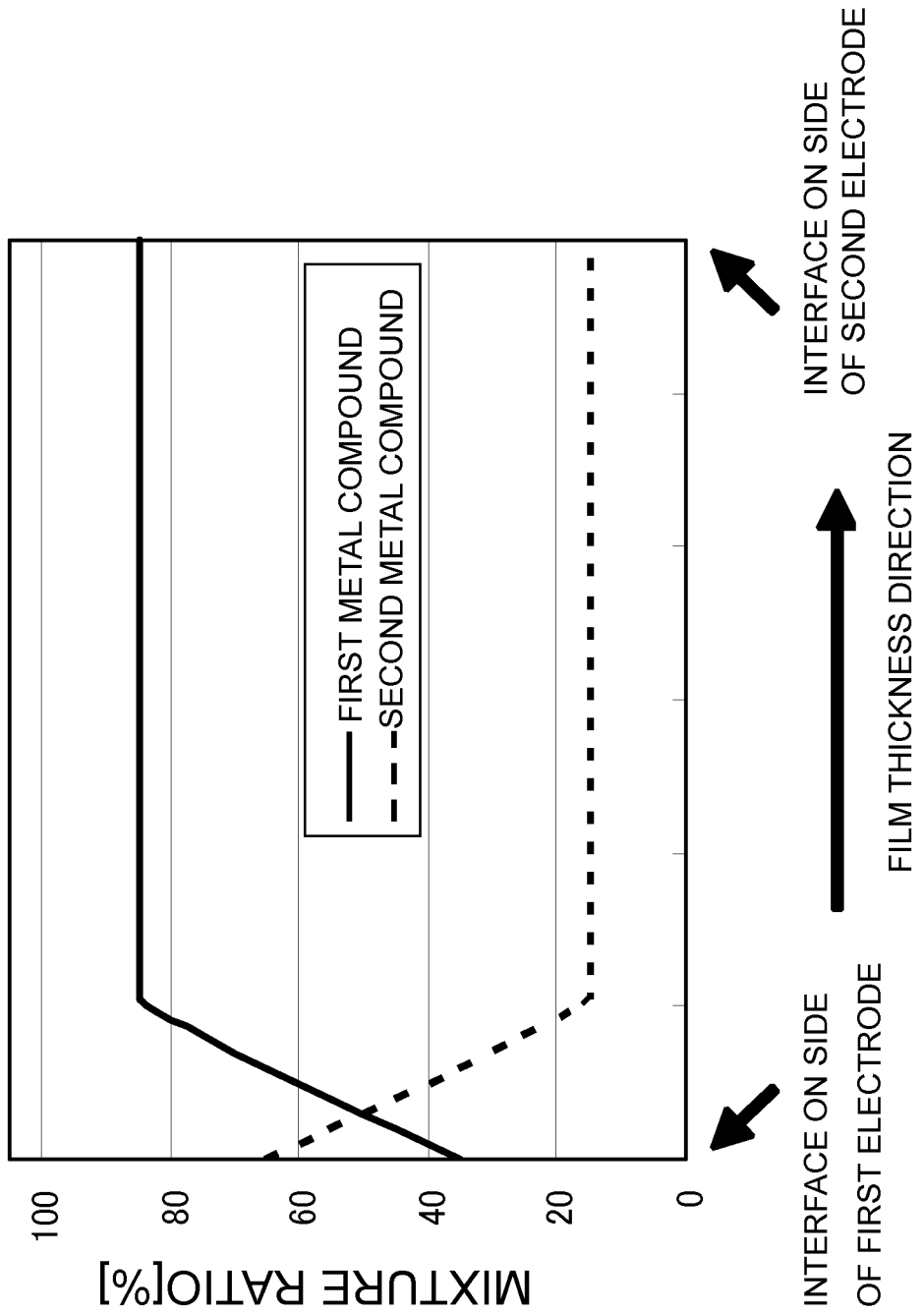
FIG. 5 is a diagram illustrating an example of the mixture ratio distribution of the mixture gradient layer according to the invention.

FIG. 5 is a graph illustrating a change in the mixture ratio of the mixture gradient layer in accordance with a third mode of the organic EL element of the invention. In this mode, since the laminated mixture gradient layer is laminated on the first electrode 102, the mixture gradient layer has a gradient in which the ratio of the second metal compound decreases up to partway along, and thereafter, the first and second metal compounds are mixed at a constant mixture ratio. Therefore, the entire mixture gradient layer includes two layers: a layer which has a gradient in which the ratio of the second metal compound decreases on the side of the second electrode and a layer in which the first and second metal compounds are mixed at a constant mixture ratio. However, an important point is that the mixture ratios are the same as each other in the interface between the two layers. The third mode is different from the second mode in that the characteristics of the second metal compound can be realized even in the interface on the side of the second electrode since the second metal compound is present at the constant mixture ratio up to the second electrode. That is, when a material such as molybdenum oxide is used which has an excellent hole-carrying property, but has poor tolerance to pure water or alkali, the first metal compound can have the tolerance by mixing the second metal compound at the constant ratio. For example, since nickel oxide, titanium oxide, or the like is with an excellent-tolerance, nickel oxide, titanium oxide, or the like is preferably used. At this time, the ratio of the second metal compound in the constant ratio region is preferably in the range of 5 wt % to 30 wt %.

Figure 6:
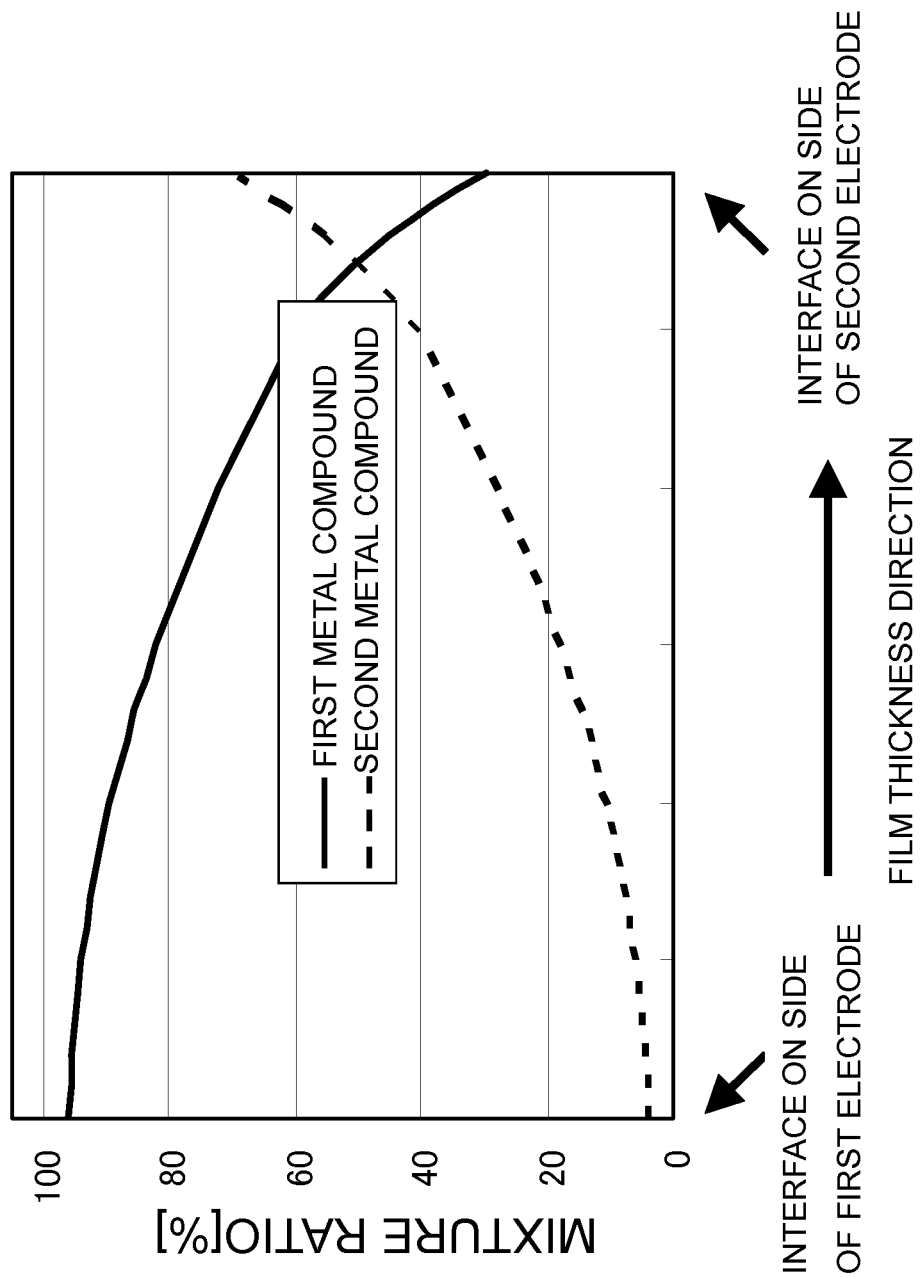
FIG. 6 is a diagram illustrating an example of the mixture ratio distribution of the mixture gradient layer according to the invention.

FIG. 6 is a graph illustrating a change in the mixture ratio of the mixture gradient layer in accordance with a fourth mode of the organic EL element of the invention. In the fourth mode, unlike the first to third modes, the entire mixture gradient layer has a gradient in which the ratio of the first metal compound monotonically decreases from the first electrode to the second electrode so that the ratio of the second metal compound is the maximum in the interface on the side of the second electrode. Such a mixture ratio distribution is suitable when the injection efficiency of the second metal compound into the organic luminescent layer is excellent. At this time, the ratio of the first metal compound is preferably 50 wt % or more in the interface on the side of the first electrode and the ratio of the second metal compound is preferably 50 wt % or more in the interface on the side of the second electrode, since the functional layer with an excellent injection property in each interface can be realized. This is because the characteristics of the metal compound as the main component function. Further, when the ratio of the second metal compound is high on the side of the second electrode, the tolerance of the surface of the mixture gradient layer can be improved. Therefore, the surface of the mixture gradient layer can be prevented from deteriorating due to the oxygen or moisture of the atmosphere in a process of forming the organic luminescent layer and solvent for forming the organic luminescent layer.

Figure 7:
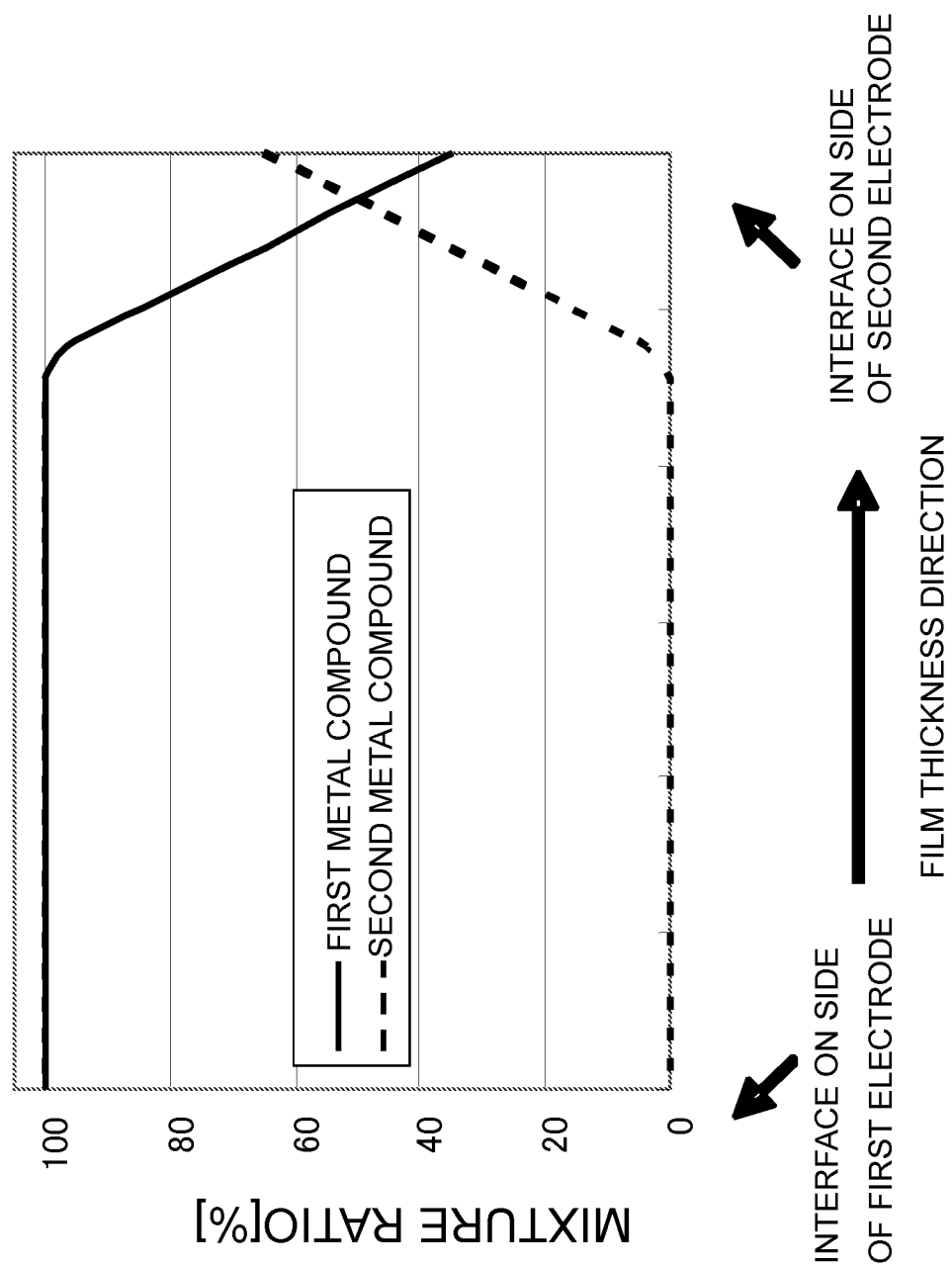
FIG. 7 is a diagram illustrating an example of the mixture ratio distribution of the mixture gradient layer according to the invention.

In a fifth mode in which the second mode is applied to the fourth mode, as shown in FIG. 7, a mixture gradient layer includes a layer of a single substance of the first metal compound laminated on the side of the first electrode and a gradient layer which is laminated on this layer and in which the ratio of the second metal compound monotonically increases from 0. With such a configuration, the injection property is improved since the mixture ratio of the second metal compound is the maximum in the vicinity of the interface on the side of the second electrode coming into contact with the luminance medium layer. Further, the hole-carrying property can be ensured since only the first metal compound is used from the other regions. Furthermore, when the ratio of the second metal compound is 50 wt % or more in the interface on the side of the second electrode, the functional layer with an excellent injection property in this interface can be realized.

Figure 8:
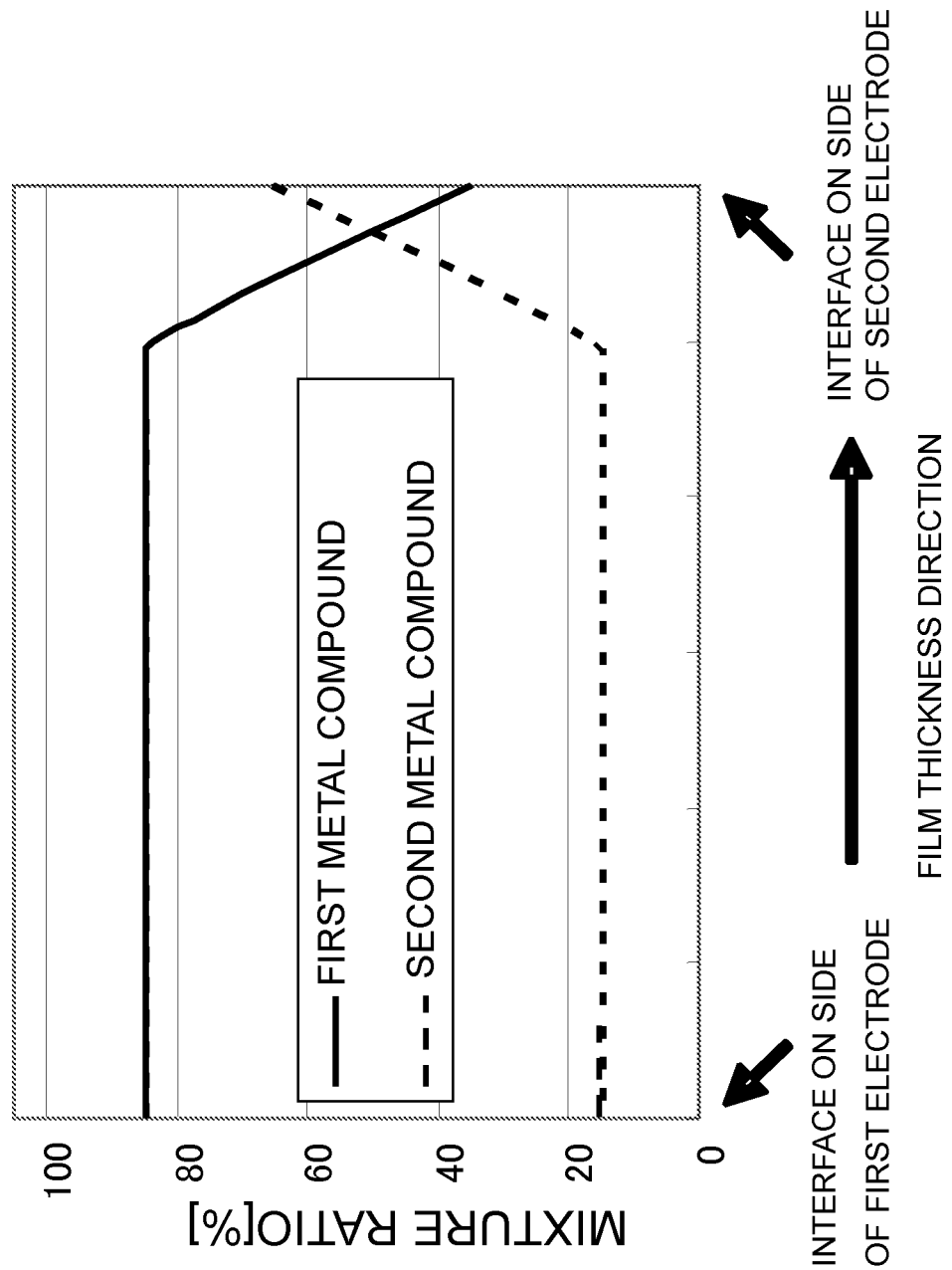
FIG. 8 is a diagram illustrating an example of the mixture ratio distribution of the mixture gradient layer according to the invention.

In a sixth mode in which the third mode is applied to the fourth mode, as shown in FIG. 8, the mixture gradient layer includes a layer in which the first and second metal compounds are laminated at a constant ratio on the side of the first electrode and a gradient layer in which the ratio of the second metal compound monotonically increases from the mixture ratio. With such a configuration, it is possible to have the tolerance and the characteristics of the second metal compound with an excellent injection property into the luminescent medium layer on the side of the second electrode. At this time, the ratio of the second metal compound in the constant ratio region is preferably in the range of 5 wt % to 30 wt % and the ratio of the second metal compound is preferably 50 wt % or more in the interface on the side of the second electrode.

In the first to sixth modes described above, the weight concentration ratio of the second metal compound is 50 wt % in both interfaces on the sides of the anode and the cathode. However, when the hole-carrying property, the environmental tolerance, and the solvent tolerance of the functional layer can be compatible with each other, the molar concentration ratio of the second metal compound on the side of the cathode may be in the range of 20 mol % to 75 mol %. In this case, the weight concentration ratio is preferably determined depending on a kind of second metal compound to be used. For example, when the titanium oxide is used as the second metal compound, the molar concentration ratio is in the range of 20 mol % to 75 mol % and the weight concentration ratio is in the range of 15 wt % to 62 wt %. Even in this case, as in the first to sixth modes, the concentration of the second metal compound has a gradient monotonically increasing or monotonically decreasing from the cathode to the anode.

Substrate

When the substrate 101 is a display side, the substrate 101 has a light-transmissive property. Therefore, a base substrate with a given strength can be used. For example, a glass substrate or a plastic film or sheet can be used. Therefore, when a thin glass substrate with a thickness of 0.2 mm to 1.0 mm is used, it is possible to obtain a thin organic EL element with a high barrier property.

First Electrode

A conductive substance with which a transparent or translucent electrode is used can be suitably used in the first electrode 102.

When the first electrode 102 is an anode, for example, an indium-tin composite oxide (hereinafter, referred to as ITO), an indium-zinc composite oxide (hereinafter, referred to as IZO), or a composite oxide of tin oxide, zinc oxide, indium oxide, and aluminum zinc can be used.

The ITO can be preferably used, since the ITO has low resistance, solvent tolerance, high transparency. Therefore, the ITO can be film-formed on the substrate 101 by a deposition method or a sputtering method.

The first electrode can be formed by an application and thermal decomposition method of applying a precursor such as octylic acid indium or acetone indium on the substrate 101 and forming an oxide by thermal decomposition. Alternatively, metal such as aluminum, gold, or silver can be deposited in a translucent form. Alternatively, an organic semiconductor such as polyaniline can be also used.

The first electrode 102 may be patterned by etching, as necessary. Further, surface activation may be performed by a UV process, a plasma process, or the like.

Insulation Layer

The insulation layer 107 can be formed so as to partition the luminescent region corresponding to each pixel. The insulation layer 107 is preferably formed so as to over the end portion of a pixel electrode 102. In general, in the active matrix driving type organic EL display device 100, the pixel electrode 102 is formed for each pixel and each pixel is configured to occupy an area as larger as possible. Therefore, the insulation layer 107 is formed so as to cover the end of the pixel electrode 102. The most preferable shape of the insulation layer 107 is a lattice shape that partitions the pixel electrodes 102 at the shortest distance.

The material of the insulation layer 107 has to have an insulation property, and thus a photosensitive material or the like can be used. The photosensitive material may be of a positive type or a negative type. Examples of the photosensitive material include a radical photopolymerizable or cationic photopolymerizable light curing resin or copolymer, polyvinyl phenol, polyvinyl alcohol, a novolak resin, polyimide resin, and cyanoethyl pullulan containing an acrylic nitrile component. Further, an inorganic insulation material such as $SiO_2$ or $TiO_2$ can be used as the material of the inorganic insulation layer.

The height of the insulation layer 107 is preferably in the range of about 0.1 μm to about 30 μm and is more preferably in the range of about 0.5 μm to about 2 μm. When the height of the insulation layer 107 is higher than 20 μm, the formation and sealing of the counter electrode 106 are disturbed. When the height of the insulation layer 107 is lower than 0.1 μm, the insulation layer 107 does not cover the end of the pixel electrode 102. Alternatively, short-circuit with an adjacent pixel may occur when the luminescent medium layer 105 is formed or color mixing may occur.

A method of forming the insulation layer 107 is different depending on a material. That is, when the insulation layer 107 is formed of an inorganic material, a known dry film forming method such as a resistance heating deposition method, an electron beam deposition method, a reactivity deposition method, an ion plating method, or a sputtering method can be used depending on a material. When the insulation layer 107 is formed of an organic material, a known wet film forming method such as an ink jet printing method, a gravure printing method, or a screen printing method can be used depending on a material. However, the invention is not limited thereto.

As a method of patterning the insulation layer 107, a method of forming an inorganic film uniformly on a base substrate (the substrate 101 and the pixel electrodes 102), performing masking with a resist, and then performing dry etching may be used or a method of coating a photosensitive resin on the base substrate and performing a predetermined pattern by a photolithography technique may be used depending on a material or a film forming method. However, the invention is not limited thereto. As necessary, a water repellent agent may be added to a resist and a photosensitive resin, a multi-layer structure of a hydrophilic material and a hydrophobic material may be used, or a water-repellent property or hydrophilic property may be granted to a subsequent film forming material after the plasma or UV is emitted.

A partition wall may be formed as, for example, a multi-stage partition wall having a two-layer structure. In this case, a first stage partition wall can be formed so as to cover end of the first electrode and can be formed in a shape such as a backward tapered shape or a forward tapered shape. Examples of the material include inorganic oxide such as silicon oxide, tin oxide, aluminum oxide, or titanium oxide, inorganic nitride such as silicon nitride, titanium nitride, or molybdenum nitride, and inorganic oxynitride such as silicon oxynitride. However, the invention is not limited thereto. Of the inorganic insulation films, silicon nitride, silicon oxide, and titanium oxide are more suitable. The material can be formed by a dry coating method such as a sputtering method, a plasma CVD method, a resistance heating deposition method. Further, an inorganic insulation film may be formed by applying ink containing an inorganic insulation material by a known applying method such as a spin coater, a bar coater, a roll coater, a dye coater, or a gravure coater, and then removing a solvent in a baking step such as atmosphere drying or heating drying. Next, a photosensitive resin is coated on the inorganic insulation film and exposure and development processes are performed to form the first stage partition wall. As the photosensitive resin, any one of a positive resist and a negative resist is used. A commercially available resist may be used. As a step of forming the pattern, a method of obtaining a predetermined pattern by a photolithography technique may be used. The invention is not limited to the above-described method, but other methods may be used. Surface processing such as plasma irradiation or UV irradiation may be performed on the inorganic insulation film, as necessary. The film thickness of the first stage partition wall is preferably in the range of 50 nm to 1000 nm to ensure an insulation property, since a conductive material such as silicon oxide may be used depending on the thickness. Further, when the film thickness of the first stage partition wall is 150 nm or more, the first stage partition wall can be suitably used. After the first stage partition wall is formed, a second stage partition wall formed of a photosensitive resin can be formed by the above-described method.

Luminescent Medium Layer

The luminescent medium layer 105 has a lamination structure of the organic luminescent layer 104 including one or more layers and the functional layer 103 including one or more layers. The functional layer 103 includes a hole-carrying layer, a hole-injection layer, an inter-layer layer, an electron-block layer, an electron-carrying layer, an electron-injection layer, and a hole-block layer as constituent elements. As a frequently used arrangement, the layer 103a is formed as the hole-carrying layer, the layer 103b is formed as the hoe-injection layer, the inter-layer layer, or the electron-block layer, the layer 103c is formed as the electron-carrying layer or the hoe-block layer, and the layer 103d is formed as the hole-injection layer. The mixture gradient layer can be formed by any one of the layers of the functional layer 103. The mixture gradient layer is preferably disposed in the layer 103a or 103b so as to operate as the hole-injection layer or the hole-carrying layer or is formed as a layer adjacent to the hole-injection layer or the hole-carrying layer. The mixture gradient layer is more preferably disposed in the layer 103a so as to operate as the hole-carrying layer.

The material used as the hole-carrying material other than the mixture gradient layer can be suitably used in the material of the hole-carrying layer 103a according to the embodiment of the invention. For example, a polyaniline derivative, a polythiophene derivative, a polyvinyle carbarzole (PVK) derivative, poly(3,4-ethylenedioxythiophene) (PEDOT), an inorganic material, or the like can be used. The mixture gradient layer is more preferably used.

Examples of the inorganic material include alkali metal elements such as Li, Na, K, Rb, Ce, and Fr, alkali earth metal elements such as Mg, Ca, Sr, and Ba, lanthanoids such as La, Ce, Sm, Eu, Gd, and Yb, metal elements such as Au, Cu, AL, Fe, Ni, Ru, Sn, Pb, Cr, Ir, Nb, Pt, W, Mo, Ta, Pa, and Co, Si, and Ge and include compounds such as oxides, carbides, nitrides, and borides thereof.

The material of the hole-injection layer 103b according to the embodiment of the invention can be also used in the mixture gradient layer. Examples of other materials include polyvinyle carbarzole or a derivative of polyvinyle carbarzole and a polymer with aromatic amine such as a polyarylene derivative having aromatic amine in a side-chain or amain chain, an arylamine derivative, or a triphenyl diamine derivative. The hole-injection layer is formed by various coating methods such as a spin coater or a relief printing method by solving or dispersing the material in a solvent. When an inorganic material is used as the material of the inter-layer layer 103b, metal oxide is formed by a vacuum deposition method, a sputtering method, or a CVD method.

The inter-layer layer may be formed as a layer between the organic luminescent layer and an electrode. The inter-layer layer as the electron-block layer is preferably provided between the organic luminescent layer and the hole-injection layer, so that the luminescent lifetime of the organic EL element can be improved by the inter-layer layer. After the hole-injection layer is formed, the inter-layer layer can be laminated on the hole-injection layer. In general, the inter-layer layer is formed so as to cover the hole-injection layer. However, the inter-layer layer may be formed by patterning, as necessary.

Examples of an organic material of the inter-layer layer include polyvinyle carbarzole or a derivative of polyvinyle carbarzole and a polymer with aromatic amine such as a polyarylene derivative having aromatic amine in a side-chain or amain chain, an arylamine derivative, or a triphenyl diamine derivative. Examples of an inorganic material of the inter-layer layer include transition metal oxide such as $Cu_2O$, $Cr_2O_3$, $Mn_2O_3$, NiO, CoO, $Pr_2O_3$, $Ag_2O$, $MoO_2$, ZnO, $TiO_2$, $V_2O_5$, $Nb_2O_5$, $Ta_2O_5$, $MoO_3$, $WO_3$, and $MnO_2$, and inorganic compound containing one or more kinds of nitrides or sulfides thereof. The invention is not limited to the above-described materials, and other materials may be used.

The organic material of the inter-layer layer is solved or stably dispersed in a solvent and is used as organic inter-layer ink (a liquid material of the organic inter-layer layer). As the solvent used to solve or disperse the material of the organic inter-layer layer, a single or a mixed solvent of toluene, xylene, acetone, anisole, methyl ethyl ketone, methyl isobutyl ketone, cyclohexanone, and the like is used. Among them, an aromatic organic solvent such as toluene, xylene, or anisole is suitably used in terms of solubility of the organic inter-layer material. Further, a surface acting agent, an antioxidizing agent, a viscosity modifier, an ultraviolet absorbing agent, or the like may be added to the organic inter-layer ink, as necessary.

A material having a work function equal to or greater than the hole-injection layer is preferably selected as the material of the inter-layer layer. A material having a work function equal to or less than the organic luminescent layer 16 is more preferably selected. This is because an unnecessary injection barrier is made not to be formed when holes are injected from the hole-injection layer to the organic luminescent layer 16. Further, to obtain an effect of confining charge which does not contribute to the luminescence from the organic luminescent layer 16, a material with a band gap of 3.0 eV or more is preferably used and a material with a band gap of 3.5 eV or more is more preferably used.

When the inter-layer layer is formed, a known dry film forming method such as a resistance heating deposition method, an electron beam deposition method, a reactivity deposition method, an ion plating method, or a sputtering method can be used or a known wet film forming method such as an ink jet printing method, a relief printing method, a gravure printing method, or a screen printing method can be used depending on a material. However, the invention is not limited to the above methods, but other methods may be used.

In general, a material used as an organic luminescent material can be suitably used as the organic luminescent material used in the organic luminescent layer 104 according to the embodiment of the invention. Examples of the organic luminescent material include a fluorescent low molecule-based material, which can be luminescent from a singled state, such as a coumalin-based material, a perylene-based material, a pyran-based material, an anthrone-based material, a porphyrin-based material, a quinacridone-based material, an N,N'-dialkyl-substituted quinacridone-based material, a naphthalimide-based material, or an N,N'-diaryl-substituted pyrrolo-pyrrole-based material, and a kown phosphorescent low-molecular material, which can be luminescent from a rare-earth metal complex-based triplet state. The material is film-formed by a dry process such as a vacuum deposition method.

Further, a film is formed by a wet process in the atmosphere, when the above-described material is solved or dispersed in a single or a mixed solvent of toluene, xylene, acetone, anisole, methyl anisole, dimethyl anisole, ethyl benzoate, methyl benzoate, mesitylene, tetralin, amyl benzene, methyl ethyl ketone, methyl isobutyl ketone, cyclohexanone, methanol, ethanol, isopropyl alcohol, ethyl acetate, butyl acetate, water, and the like and is used as an organic luminescent application liquid.

A material in which a coumalin-based fluorescent pigment, a perylene-based fluorescent pigment, a pyran-based pigment, an anthrone-based fluorescent pigment, a porphyrin-based fluorescent pigment, a quinacridone-based fluorescent pigment, an N,N'-dialkyl-substituted quinacridone-based fluorescent pigment, a naphthalimide-based fluorescent pigment, or an N,N'-diaryl-substituted pyrrolo-pyrrole-based fluorescent pigment is solved in a polymer such as polystryrene, polymethylmethacrylate, or polyvinyl carbazole can be used as a high-molecule-based material of the organic luminescent layer 104. Further, a PPV-based or PAF-based polymer fluorescent luminant or a polymer luminant such as a polymer phosphorescent luminant containing rare-earth metal complex can be used.

A film is formed by a wet process in the atmosphere, when the high-molecule-based material is solved or dispersed in a single or mixed solvent of toluene, xylene, acetone, anisole, methyl anisole, dimethyl anisole, ethyl benzoate, methyl benzoate, mesitylene, tetralin, amyl benzene, methyl ethyl ketone, methyl isobutyl ketone, cyclohexanone, methanol, ethanol, isopropyl alcohol, ethyl acetate, butyl acetate, water, and the like and is used as an organic luminescent application liquid.

In particular, an aromatic solvent such as toluene, xylene, anisole, methyl anisole, dimethyl anisole, ethyl benzoate, methyl benzoate, mesitylene, tetralin, or amyl benzene is more preferably used, since the aromatic solvent has good solubility of a high-molecule-based material and is easily treated.

The mixture gradient layer can be also formed of the material of the layers 103c and 103d according to the embodiment of the invention. As other materials, a material used as an electron-carrying material may be generally used by a vacuum deposition method to form a film with a triazole-based low-molecular material, an oxazole low-molecular material, an oxadiazole low-molecular material, a silole low-molecular material, a boron-based low-molecular material, salt or oxide of alkali metal such as lithium fluoride or lithium oxide or alkali earth metal, or the like. Further, a film can be formed by a printing method by the use of the electron-carrying material or an electron-injection application liquid obtained by solving the electron-carrying material in a polymer such as polystryrene, polymethylmethacrylate, or polyvinyl carbazole and solving or dispersing the electron-carrying material in a single or a mixed solvent of toluene, xylene, acetone, methyl ethyl ketone, methyl isobutyl ketone, cyclohexanone, methanol, ethanol, isopropyl alcohol, ethyl acetate, butyl acetate, water, and the like.

The thickness of each layer of the luminescent medium layer 105 is arbitrarily determined, but is preferably in the range of 0.1 nm to 200 nm.

Method of Forming Luminescent Medium Layer by Wet Process

Examples of the above-described wet process include a coating method and a printing method and examples of the coating method include a spin coater, a bar coater, a roll coater, a dye coater, and a gravure coater. It is difficult to directly form a pattern by the coating method, whereas a pattern can be directly formed by the printing method.

Accordingly, to form the luminescent medium layer 105 by the wet process, a printing method such as a relief printing method, an intaglio printing method, a screen printing method, a gravure printing method, a flexographic method, an offset printing method can be suitably used.

In particular, the relief printing method is suitable for manufacturing an organic EL element, since printing can be performed without damage to the substrate in a viscosity range in which the viscosity characteristics of an application liquid and the use efficiency of an application liquid material is thus good.

Figure 9:
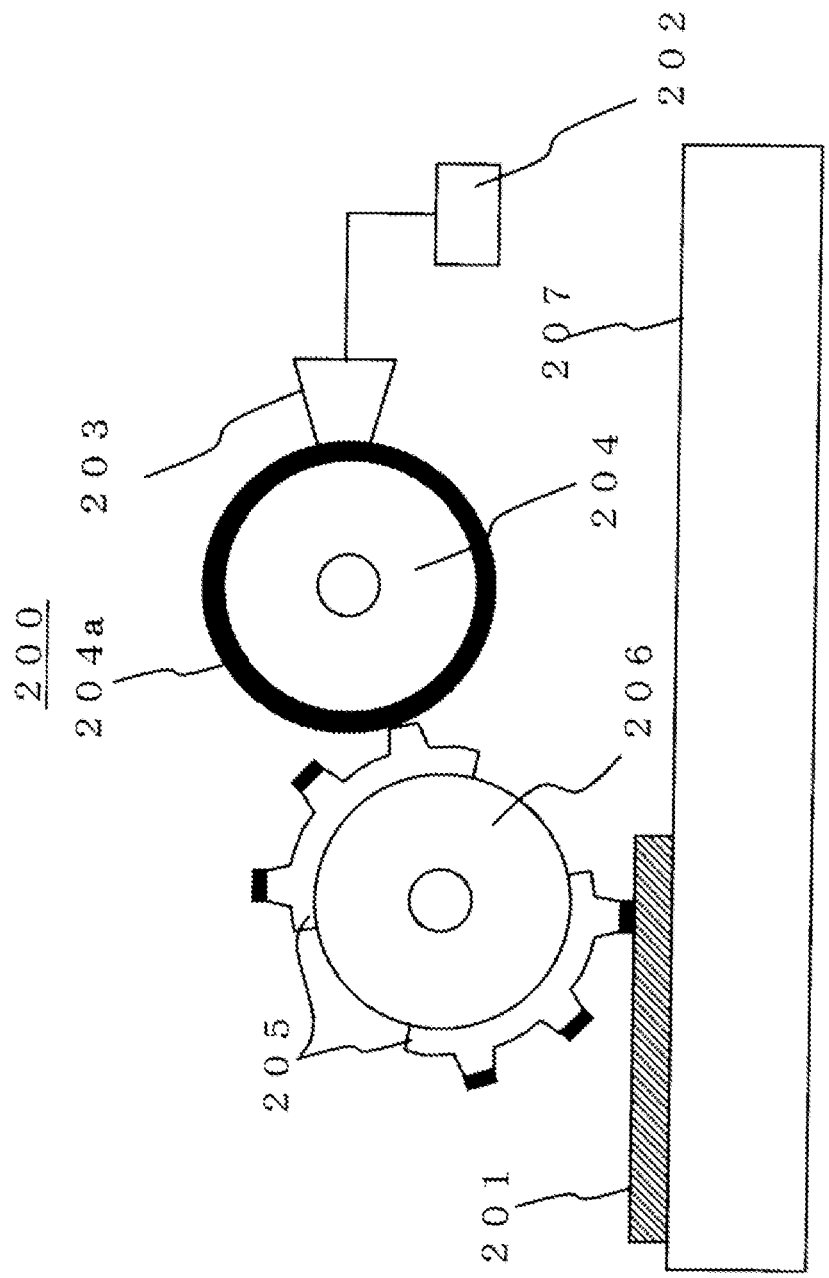
FIG. 9 is a diagram illustrating an example of a relief printing method according to the invention.

FIG. 9 is a schematic sectional view illustrating a relief printing apparatus 200 when an application liquid containing the material of the luminescent medium layer 105 is pattern-printed on a print substrate 201 in which electrodes or the like are formed.

The relief printing apparatus 200 according to the embodiment of the invention includes an ink tank 202, an ink chamber 203, an anilox roll 204, and a plate trunk 206 on which plates 205 with a relief plate are mounted. The ink tank 202 stores an application liquid having the material of the luminescent medium layer 103, so that the application liquid can be sent from the ink tank 202 to the ink chamber 203. The anilox roll 204 comes into contact with an application liquid supplying unit of the ink chamber 203 and is held rotatably.

As the anilox roll 204 rotates, a layer 204a formed by applying the application liquid supplied to the surface of the anilox roll 204 is formed with a uniform film thickness. The applied layer 204a is transferred to convex portions of the plates 205 mounted on the plate trunk 206 driven rotatably near the anilox roll 204.

On a flat table 207, the print substrate 201 is transported up to a print position by the convex portions of the plates 205 by a transporting unit (not shown). The ink in the convex portions of the plates 205 is printed on the print substrate 201 and is subjected to a dry process, as necessary, so that the luminescent medium layer 103 can be suitably formed on the print substrate 201.

The plate 205 with the relief plate is preferably a photosensitive resin relief plate. The photosensitive resin relief plate is a solvent development type in which a developer used when an exposed resin plate is developed is an organic solvent or of a water development type in which a developer is water. The solvent development type photosensitive relief plate has tolerance to water-based ink and the water development type photosensitive relief plate has tolerance to organic solvent-based ink. The solvent development type or the water development type can be suitably selected depending on the characteristics of an application liquid containing the material of the luminescent medium layer 105.

For example, the luminescent medium layer can be manufactured by installing the hole-injection layer 103a in a vacuum, forming the inter-layer layer 103b and the organic luminescent layer 104 in the air by the use of the relief printing apparatus 200 by a relief printing method, and then forming the electron-injection layer 103c in a vacuum.

Second Electrode

When the second electrode 106 serves as a cathode, a material with high electron injection efficiency to the luminescent medium layer 105 and a low work function is used. Specifically, a metal simple element such as Mg, Al, or Yb is used. Alternatively, Al or Cu with high stability and high conductivity may be laminated on the interface coming into contact with the luminescent medium layer with Li or a compound of Li, LiF, and the like interposed therebetween so as to have about 1 nm. Further, to make the electron injection efficiency to be compatible with stability, an alloy of one or more kinds of metal, such as Li, Mg, Ca, Sr, La, Ce, Er, Eu, Sc, Y, and Yb, with a low work function and one or more kinds of metal elements, such as Ag, Al, and Cu, with stability may be used. Specifically, an alloy of MgAg, AlLi, CuLi, or the like may be used.

As a method of forming the second electrode 106, a resistance heating deposition method, an electron beam deposition method, a reactivity deposition method, an ion plating method, or a sputtering method can be used depending on a material.

Sealing Member

A passivation layer, a sealing member, and a resin layer used to bring the passivation layer a close contact with the sealing material can be formed on the second electrode to block the organic EL element from the outside so that an atmospheric gas does not reach the organic EL element. Alternatively, the sealing member hermetically sealing the cap-shaped sealing material with an adhesive may be configured.

As the passivation layer, metal oxide such as silicon oxide or aluminum oxide may be used. Metal fluoride such as aluminum fluoride or magnesium fluoride, metal nitride such as silicon nitride, aluminum nitride, or carbon nitride, metal oxynitride such as silicon oxynitride, or metal carbide such as silicon carbide may be used. A lamination film such as a polymer resin film such as an acrylic resin, an epoxy resin, a silicon resin, or a polyester resin may be used, as necessary. In particular, silicon oxide, silicon nitride, or silicon oxynitride is preferably used in terms of a barrier property and transparency. Further, a laminated film or a gradient film in which a film density is variable may be used depending on a film formation condition.

As a method of forming the passivation layer, a resistance heating deposition method, an electron beam deposition method, a reactivity deposition method, an ion plating method, a sputtering method, or a CVD method can be used depending on a material. In particular, a CVD method is preferably used in terms of a barrier property and transparency. Examples of the CVD method include a thermal CVD method, a plasma CVD method, a catalyst CVD method, and a VUV-CVD method. Further, as a reaction gas of the CVD method, a gas such as $N_2$, $O_2$, $NH_3$, $H_2$, or $N_2O$ may be added to an organic silicon compound such as mono-silane, hexamethyldisilazane (HMDS), or tetraethoxysilane, as necessary. For example, the density of the film may be changed by varying the flow rate of silane and hydrogen or carbon may be contained in the film by the reaction gas to be used. The film thickness of the sealing layer is different depending on the electrode step difference of the organic EL element, the height of the partition wall of the substrate, the necessary barrier characteristics, or the like. In general, the film thickness of the sealing layer is generally in the range of about 10 nm to about 10000 nm.

The sealing material has to be a material with low permeability of moisture or oxygen. Examples of the sealing material include ceramics such as alumina, silicon nitride, or boron nitride, glass such as alkali-free glass or alkali glass, quartz, and a moisture resistance film. Examples of the moisture resistance film include a film in which SiOx is formed on both surfaces of a plastic material by a CVD method, a polymer film in which a film with small permeability and a film with water absorbability or an absorber are applied. The moisture vapor transmission rate of the moisture resistance film is preferably $10^{-6}$ $g/m^2/day$ or less.

Examples of the material of the resin layer include a photocurable adhesive resin such as an epoxy-based resin, an acrylic-based resin, a silicon resin, a thermal curable adhesive resin, a two-component curable adhesive resin, an acrylic-based resin such as ethylene ethyl acrylate (EEA) polymer, a vinyl-based resin such as ethylene vinyl acetate (EVA), a thermoplastic resin such as polyimide or synthetic rubber, and a thermoplastic adhesive resin such as an acid-modified product of polyethylene or polypropylene. Examples of a method of forming the resin layer on the sealing member include a solvent solution method, an extrusion lamination method, a melting/hot-melt method, a calendar method, a nozzle application method, a screen printing method, a vacuum lamination method, and a thermal roll lamination method. A material having a moisture absorption property or an oxygen absorption property may be contained, as necessary. The thickness of the resin layer formed on the sealing member is arbitrarily determined depending on the size or shape of the organic EL element to be sealed. However, the thickness of the resin layer is preferably in the range of 5 μm to 500 μm. Here, the resin layer is formed on the sealing member. However, the resin layer may be formed directly on the organic EL element.

Finally, the organic EL element and the sealing member are bonded in a sealing chamber. When the sealing member is configured to have a two-layer structure of the sealing material and the resin layer and a thermoplastic resin is used in the resin layer, only pressure-bonding is preferably performed with a heated roll. When a thermal curable adhesive resin is used, pressure-bonding is performed with a heated roll and thermal curing is preferably performed at a curing temperature. When a photo-curable adhesive resin is used, curing can be performed by performing pressure-bonding with a roll and then emitting light.

According to the aspects of the invention, at least one functional layer formed between the first electrode and the organic luminescent layer includes a film obtained by mixing the two kinds of metal compounds and the functional layer is a functional layer in which a gradient is obtained at least partially in a film thickness direction for a ratio of the first metal compound to the second metal compound. Accordingly, since the degree of freedom of tolerance control and physical properties control is improved in the mixed layer, environmental tolerance or solvent tolerance by the use of the metal compound mixed film is obtained in various manufacturing processes or combination of upper and lower layers adjacent to the mixed film. Further, it is possible to provide the organic EL element and the display device including the organic EL element having compatibility between high efficient luminescence, high luminance luminescence, and long lifetime.

Further, thanks to the gradient effect of the metal compound mixed film, it is possible to further optimize a hole-injection property and a hole-carrying property in accordance with the configuration of the organic EL element or the physical properties of the adjacent layers. It is possible to provide the organic EL element and the organic EL display device having the characteristics of low-voltage driving, high luminance, high efficiency, and long lifetime, compared to the related art.

EXAMPLES

Hereinafter, examples of the invention will be described on the assumption that the first electrode serves an anode and the second electrode serves as a cathode. The invention is not limited to the examples.

Example 1

First, a glass substrate is used as the substrate. ITO as a material of the anode was formed on the substrate in a vacuum by a sputtering method and the ITO film was patterned by a photolithography method and etching of an acid solution to form a luminescent electrode section.

Next, an acrylic-based photoresist material was spin-coated as the material of an insulation layer on the entire surface of the glass substrate on which the luminescent electrode section was formed. As the condition of the spin coating, the acrylic-based photoresist material was rotated for five seconds at 150 rpm, and then was for twenty seconds at 500 rpm to obtain a conductive film with a height of 1.5 μm. Thereafter, a pattern with a lattice shape was formed by a photolithography method on the luminescent electrode section.

Figure 10:
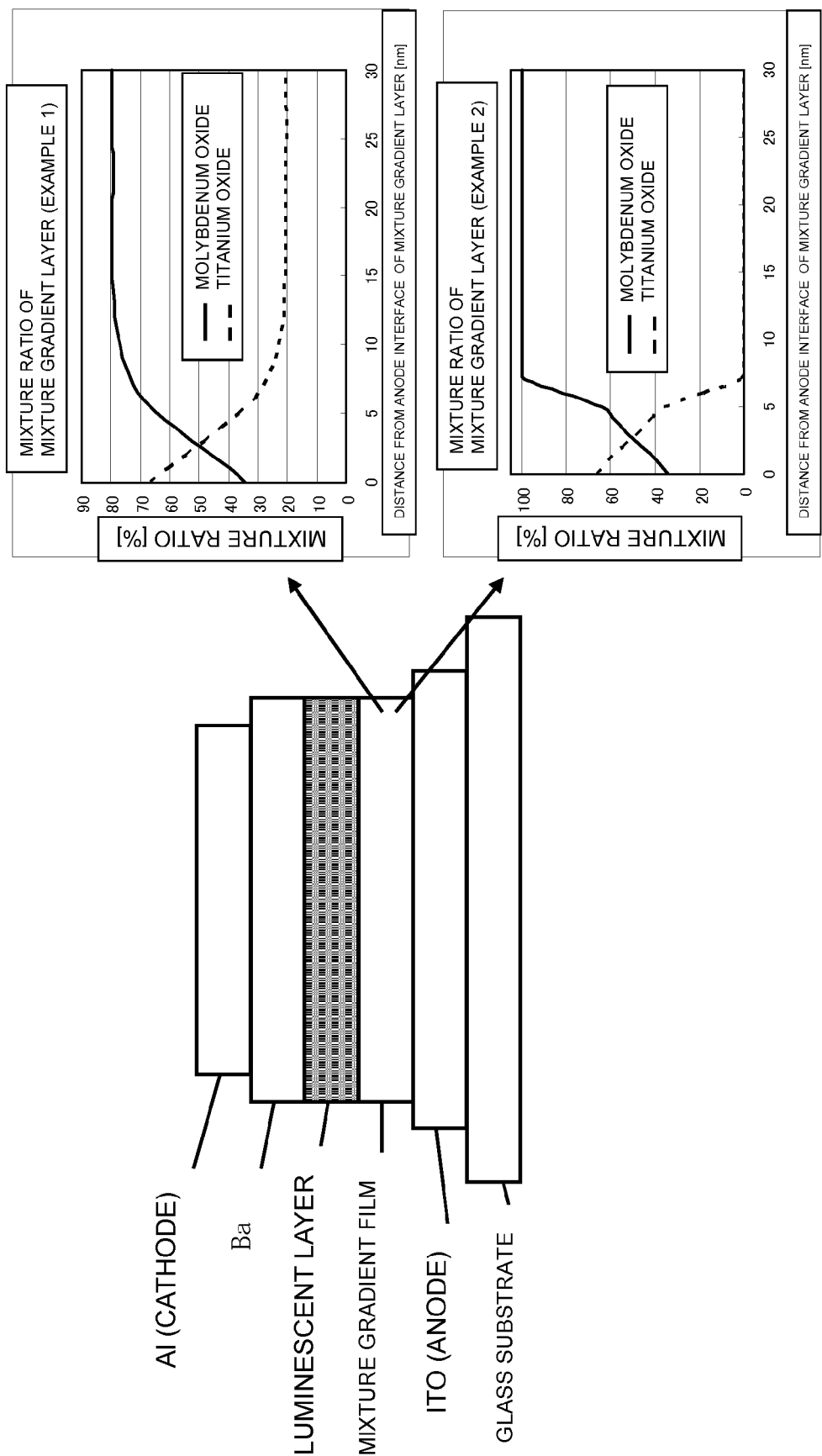
FIG. 10 is a diagram illustrating mixture ratio distributions of the organic EL element and the mixture gradient layer according to examples of the invention.

Next, molybdenum oxide and titanium oxide were co-deposition as the hole-injection layer and the hole-carrying layer in a vacuum and the deposition speed of the titanium oxide was controlled, so that the gradient was obtained at the mixture ratio. The mixture ratio of the mixture gradient film was obtained with the gradient shown in a graph shown in the right upper side of FIG. 10. The film was formed by setting the concentration of the titanium oxide to 66 wt % on the side of the anode, 20 wt % on the side of the cathode.

Next, the organic luminescent layer was formed on the hole-carrying layer in the same manner in the atmosphere by a relief printing method by the use of an application liquid in which the weight concentration of a PPV derivative which is an organic luminescent material was 1% and the weight concentrations of xylene and anisole were 84% and 15%, respectively. At this time, the dried organic luminescent layer with a film thickness of 80 nm was formed by the use of an anilox roll and a water development type photosensitive resin plate.

Next, the electron-injection layer with a thickness of 5 nm was formed of Ba as an electron-injection material in a vacuum by a vacuum deposition method by the use of a mask.

Finally, the electrode with a thickness of 150 nm was formed of Al as a cathode material by a vacuum deposition method in a vacuum by the use of a mask so as to be perpendicular to the anode formed of ITO. Then, the organic EL element was obtained by hermetical sealing by the use of the glass cap and an adhesive.

The luminescent of the formed organic EL element was good without irregularity or a dark spot. The luminance at 7 V was 1220 cd/m$^2$ and a luminance half-life time at initial luminance of 1500 cd/m$^2$ was 305 hours, and thus the element characteristics of low-voltage driving, high luminance, high efficiency, and long lifetime were obtained. Further, a defect such as a dark spot was not recognized at an acceleration experiment.

Example 2

An element was manufactured by the use of the same method and material as those of Example 1. At this time, the mixture gradient film was formed with a gradient so that the concentration of titanium oxide was 66 wt % on the side of the anode and was 0 wt % on the side of the cathode. The mixture ratio of the mixture gradient film was obtained with the gradient shown in the right lower side of FIG. 10.

The luminescent of the formed organic EL element was good without irregularity or a dark spot. The luminance at 7 V was 1360 cd/m$^2$ and a luminance half-life time at initial luminance of 1500 cd/m$^2$ was 290 hours, and thus the element characteristics of low-voltage driving, high luminance, and long lifetime were obtained. Further, a defect such as a dark spot was not recognized at an acceleration experiment.

Example 3

An element was manufactured by the use of the same method and material as those of Example 1. At this time, the mixture gradient film was formed with a gradient so that the concentration of titanium oxide was 12 wt % on the side of the anode and was 62 wt % on the side of the cathode. The mixture ratio of the mixture gradient film was obtained with the gradient shown in FIG. 6.

The luminescent of the formed organic EL element was good without irregularity or a dark spot. The luminance at 7 V was 1280 cd/m$^2$ and a luminance half-life time at initial luminance of 1500 cd/m$^2$ was 325 hours, and thus the element characteristics of low-voltage driving, high luminance, and long lifetime were obtained. Further, a defect such as a dark spot was not recognized at an acceleration experiment.

Example 4

An element was manufactured by the use of the same method and material as those of Example 1. At this time, the mixture gradient film was formed with a gradient so that the concentration of titanium oxide was 66 wt % on the side of the anode and was 0 wt % on the side of the cathode. The mixture ratio of the mixture gradient film was obtained with the gradient shown in FIG. 7.

The luminescent of the formed organic EL element was good without irregularity or a dark spot. The luminance at 7 V was 1310 cd/m$^2$ and a luminance half-life time at initial luminance of 1500 cd/m$^2$ was 315 hours, and thus the element characteristics of low-voltage driving, high luminance, and long lifetime were obtained. Further, a defect such as a dark spot was not recognized at an acceleration experiment.

Comparative Example 1

The mixture gradient film was substituted by a mixture gradient film with no gradient by the use of the same method and material as those of Example 1. The mixture ratio of the titanium oxide in the mixture gradient film was set to 20 wt %.

The luminescent of the formed organic EL element was good without irregularity or a dark spot. The luminance at 7 V was 930 cd/m$^2$ and a luminance half-life time at initial luminance of 1500 cd/m$^2$ was 220 hours.

Comparative Example 2

The mixture gradient film was substituted by a molybdenum oxide single film by the use of the same method and material as those of Example 1.

A dark spot was confirmed in the luminescence of the formed organic EL element, and expansion of the dark spot was confirmed at an acceleration experiment.

TABLE 1

| | DARK SPOT | LUMINESCENT LUMINANCE (cd/m$^2$) | LUMINESCENT LIFETIME (hr) |
|---|---|---|---|
| EXAMPLE 1 | NO | 1220 | 305 |
| EXAMPLE 2 | NO | 1360 | 290 |
| EXAMPLE 3 | NO | 1280 | 325 |
| EXAMPLE 4 | NO | 1310 | 315 |
| COMPARATIVE EXAMPLE 1 | NO | 930 | 220 |
| COMPARATIVE EXAMPLE 2 | YES | — | — |

What is claimed is:

1. An organic electroluminescence element comprising:
    a substrate;
    a first electrode that is formed on the substrate;
    a luminescent medium layer formed on the first electrode, the luminescent medium layer includes at least an organic luminescent layer and one or more functional layers other than the organic luminescent layer; and
    a second electrode that faces the first electrode with the luminescent medium layer interposed between the second electrode and the first electrode,
    wherein at least one functional layer is formed between the first electrode and the organic luminescent layer and includes first and second metal compounds, and a gradient for a ratio of the first metal compound to the second metal compound is obtained at least partially in a film thickness direction of one of the at least one functional layer, and
    wherein the first metal compound is molybdenum oxide.

2. The organic electroluminescence element according to claim 1, wherein the functional layer having the gradient is a hole-injection layer or a hole-carrying layer.

3. The organic electroluminescence element according to claim 1, wherein the ratio of the first metal compound to the second metal compound monotonically increases toward a side of the second electrode.

4. The organic electroluminescence element according to claim 1, wherein the ratio of the first metal compound to the second metal compound monotonically decreases toward a side of the second electrode.

5. The organic electroluminescence element according to claim 1, wherein the functional layer having the gradient includes a first layer which has the gradient and in which a percentage of the second metal compound is 0 toward a side of the second electrode and a second layer which is formed on the first layer and on the side of the second electrode and is formed of only the first metal compound, wherein the first layer and the second layer are continuously laminated.

6. The organic electroluminescence element according to claim 1, wherein the functional layer having the gradient includes a first layer which has the gradient and in which a percentage of the second metal compound decreases toward a side of the second electrode in the entire functional layer and a second layer which is formed to be adjacent the first layer and formed on the side of the second electrode and in which the second metal compound is mixed at a constant percentage equivalent to a percentage of the second metal compound at an adjacent part of the first layer, wherein the first layer and the second layer are continuously laminated.

7. The organic electroluminescence element according to claim 1, wherein the functional layer having the gradient includes a first layer which has the gradient and in which a percentage of the second metal compound is 0 toward a side of the first electrode and a second layer which is formed on the first layer and on the side of the first electrode and is formed of only the first metal compound, wherein the first layer and the second layer are continuously laminated.

8. The organic electroluminescence element according to claim 1, wherein the functional layer having the gradient includes a first layer which has the gradient and in which a percentage of the second metal compound decreases toward a side of the first electrode in the entire functional layer and a second layer which is formed to be adjacent the first layer and on the side of the first electrode and in which the second metal compound is mixed at a constant percentage equivalent to a percentage of the second metal compound at an adjacent part of the first layer, wherein the first layer and the second layer are continuously laminated.

9. The organic electroluminescence element according to claim 1, wherein the second metal compound is one of indium oxide, titanium oxide, iridium oxide, tantalum oxide, nickel oxide, tungsten oxide, vanadium oxide, tin oxide, lead oxide, niobium oxide, aluminum oxide, copper oxide, manganese oxide, praseodymium oxide, chromium oxide, bismuth oxide, calcium oxide, barium oxide, cesium oxide, lithium fluoride, and sodium fluoride, zinc selenide, zinc telluride, gallium nitride, gallium nitride indium, magnesium silver, aluminum lithium, and copper lithium or a mixture thereof.

10. A display device comprising:
the organic electroluminescence element according to claim 1 that is prepared as a display medium.

* * * * *